(12) United States Patent
Brooks et al.

(10) Patent No.: US 6,420,214 B1
(45) Date of Patent: *Jul. 16, 2002

(54) METHOD OF FORMING AN INTEGRATED CIRCUIT DEVICE HAVING CYANATE ESTER BUFFER COAT

(75) Inventors: J. Mike Brooks, Caldwell; Jerrold L. King; Kevin Schofield, both of Boise, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/552,738

(22) Filed: Apr. 19, 2000

Related U.S. Application Data

(60) Continuation of application No. 09/257,402, filed on Feb. 25, 1999, now Pat. No. 6,060,343, which is a division of application No. 08/604,219, filed on Feb. 20, 1996, now Pat. No. 5,903,046.

(51) Int. Cl.[7] .................... H01L 21/44; H01L 21/48; H01L 21/50
(52) U.S. Cl. ................ 438/127; 438/108; 438/902; 29/841; 29/855
(58) Field of Search .................. 438/127, 108, 438/902; 29/841, 855

(56) References Cited

U.S. PATENT DOCUMENTS 3,755,402 A 8/1973 Grigat et al.
3,994,949 A 11/1976 Meyer et al.

(List continued on next page.)

OTHER PUBLICATIONS

Shimp et al., *Arocy© Cyanate Ester Resins Chemistry, Properties and Applications*, Second Edition, 1–36 (1990).

*Primary Examiner*—John F. Niebling
*Assistant Examiner*—David A. Zarneke
(74) *Attorney, Agent, or Firm*—Mueting, Rasch & Gebhardt, P.A.

(57) ABSTRACT

An integrated circuit including a fabricated die having a cyanate ester buffer coating material thereon. The cyanate ester buffer coating material includes one or more openings for access to the die. A package device may be connected to the die bond pads through such openings. Further, an integrated circuit device is provided that includes a fabricated wafer including a plurality of integrated circuits fabricated thereon. The fabricated wafer has an upper surface with a cyanate ester buffer coating material cured on the upper surface of the fabricated integrated circuit device. Further, a method of producing an integrated circuit device includes providing a fabricated wafer including a plurality of integrated circuits and applying a cyanate ester coating material on a surface of the fabricated wafer. The application of cyanate ester coating material may include spinning the cyanate ester coating material on the surface of the fabricated wafer to form a buffer coat.

12 Claims, 3 Drawing Sheets

U.S. PATENT DOCUMENTS

| | | |
|---|---|---|
| 4,022,755 A | 5/1977 | Tanigaichi et al. |
| 4,056,681 A | 11/1977 | Cook, Jr. |
| 4,330,658 A | 5/1982 | Ikeguchi et al. |
| 4,740,584 A | 4/1988 | Shimp |
| 4,820,855 A | 4/1989 | Gaku et al. |
| 5,026,667 A | 6/1991 | Roberts, Jr. |
| 5,034,801 A | 7/1991 | Fischer |
| 5,102,718 A | 4/1992 | Tingerthal et al. |
| 5,132,778 A | 7/1992 | Juskey et al. |
| 5,137,846 A | 8/1992 | Machuga et al. |
| 5,194,930 A | 3/1993 | Papathomas et al. |
| 5,198,695 A | 3/1993 | Hanes et al. |
| 5,268,193 A | 12/1993 | Beuhler et al. |
| 5,300,735 A | 4/1994 | Yokono et al. |
| 5,388,328 A | 2/1995 | Yokono et al. |
| 5,438,022 A | 8/1995 | Allman et al. |
| 5,504,374 A | 4/1996 | Oliver et al. |
| 5,530,288 A | 6/1996 | Stone |
| 5,563,380 A | 10/1996 | Restoker et al. |
| 5,569,493 A | 10/1996 | Granger et al. |
| 5,571,740 A | 11/1996 | Peterson |
| 5,579,573 A | 12/1996 | Baker et al. |
| 5,604,978 A | 2/1997 | Sherif et al. |
| 5,605,781 A | 2/1997 | Gelorme et al. |
| 5,656,862 A | 8/1997 | Papathomas et al. |
| 5,660,920 A | 8/1997 | Buckley et al. |
| 5,667,884 A | 9/1997 | Bolger |
| 5,903,046 A | 5/1999 | Brooks et al. |
| 6,060,343 A | 5/2000 | Brooks et al. |

METHOD OF FORMING AN INTEGRATED CIRCUIT DEVICE HAVING CYANATE ESTER BUFFER COAT

This is a continuation of application Ser. No. 09/257,402, filed Feb. 25, 1999, issued as U.S. Pat. No. 6,060,343, which is a division of application Ser. No. 08/604,219, filed Feb. 20, 1996, issued as U.S. Pat No. 5,93,046, which are incorporated herein by reference.

FIELD OF THE INVENTION

The present invention relates to an integrated circuit device and a method of producing an integrated circuit device. More particularly, the present invention relates to an integrated circuit device having a cyanate ester buffer coat and a method of producing the integrated circuit device.

BACKGROUND OF THE INVENTION

Both high density and lower density integrated circuits are fabricated on wafers utilizing numerous fabrication techniques, including, but not limited to photolithography, masking, diffusion, ion implantation, etc. After the wafers are fabricated, with the wafer including a plurality of integrated circuit dies, a die coat is commonly used to protect the plurality of integrated circuit dies from damage during the remainder of the manufacturing process. It is commonly known to use polyimides as the buffer or die coat when fabricating such devices or wafers.

Thermosetting resins, such as cyanate esters, have been used in various applications that span electronic, structural aerospace, and microwave transparent composites as well as encapsualants and adhesives. Cyanate esters are described in the paper *Arocy® Cyanate Ester Resins Chemistry, Properties and Applications*, by D. A. Shimp, J. R. Christerson, and S. J. Ising (Second Edition—January 1990). Some examples of uses of cyanate esters include spinning cyanate ester onto a wafer for the purpose of making a durable base for building electric conductive metal features and also circuit board configurations.

Polyimides utilized as a spin-on die coat are somewhat expensive. Many polyimides have a high dielectric constant and to not cure very quickly. Cyanate esters on the other hand have a lower dielectric constant than most polyimides and further cure more quickly than polyimides. In addition, polyimide buffer coats do not have extremely consistent photo-imageable characteristics. For example, when using photo-masking or photolithography techniques with polyimides, such techniques are not always highly successful or reliable. Therefore, in view of the above, there is a need for improved buffer coats for the fabrication process and improved integrated circuit devices resulting therefrom.

SUMMARY OF THE INVENTION

In accordance with the present invention, an integrated circuit includes a fabricated die having a cyanate ester buffer coating material thereon. The cyanate ester buffer coating material has one or more openings for access to the die. In another embodiment of the integrated circuit, die bond pads are connected to a die package device through such openings.

In accordance with another embodiment of the invention, the integrated circuit device includes a fabricated wafer including a plurality of integrated circuits fabricated thereon. The fabricated wafer includes an upper surface having a cyanate ester buffer coating material cured thereon.

In a further embodiment, the cyanate ester coating material may be cured on a substantially planar or nonplanar surface of the fabricated die. Further, the upper surface of the fabricated wafer may be a substantially planar or nonplanar surface.

In the method of the present invention, integrated circuit devices are produced by providing a fabricated wafer including a plurality of integrated circuits. The cyanate ester coating material is applied and cured on a surface of the fabricated wafer.

In further embodiments of the method, the cyanate ester coating material may be spun on the surface of the fabricated wafer to form a buffer coat, the surface of the fabricated wafer may be a substantially planar or nonplanar surface, and/or the buffer coat may be a photosensitive buffer coat.

DETAILED DESCRIPTION OF THE PREFERRED EMBODIMENT

Figure 1:
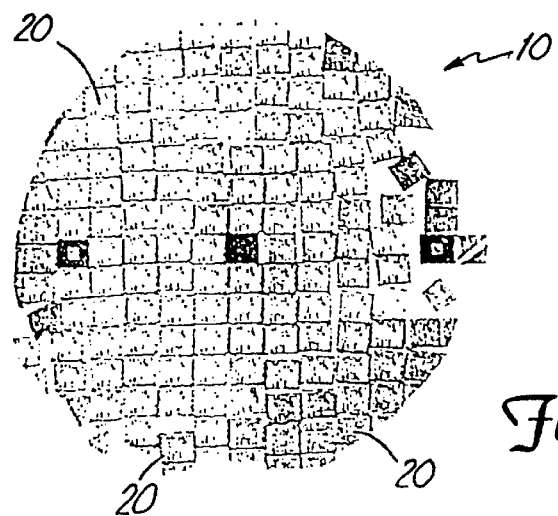
FIG. 1 is a top view of an integrated circuit wafer, as singulated, in accordance with the present invention.
Figure 2:
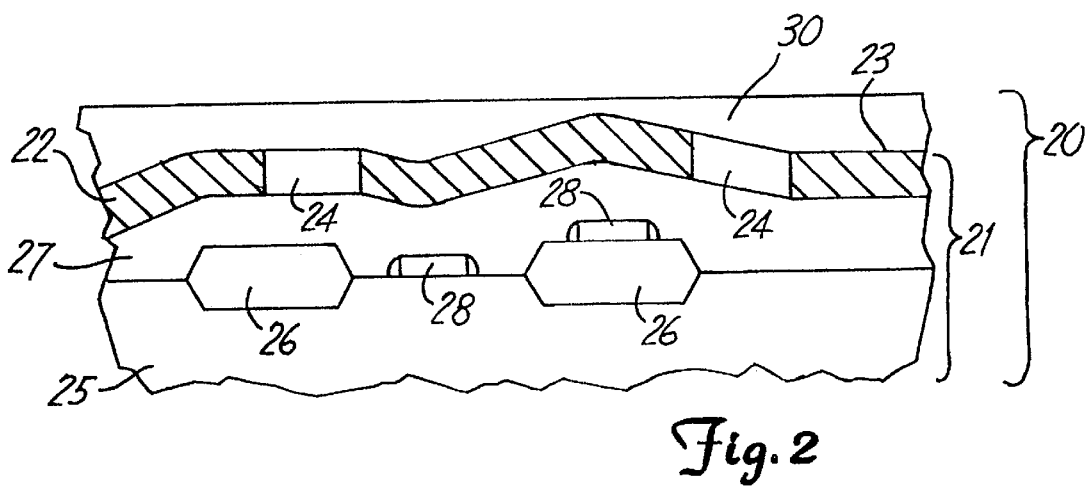
FIG. 2 is a sectional view of a part of an illustrative integrated circuit in accordance with the present invention.

With reference to FIG. 1 and 2, the integrated circuit device, or wafer 10, including the individual integrated circuit dice 20 shall be described. Integrated circuit device 10 of FIG. 1 is shown in a separated or singulated state wherein the individual integrated circuits or dice 20 are separated. The integrated circuit device or fabricated wafer 10 includes on its top surface, in an unseparated state (not shown), a buffer or die coat 30 as shown in FIG. 2. The buffer or die coat 30 is a cyanate ester coating material such as cyanate ester resins available from Ciba Polymers, a division Ciba-Geigy, having a place of business in Hawhtorne, N.Y.

The cyanate ester buffer coat 30 is applied to the fabricated integrated circuit 21 to form the buffer coated integrated circuit device or wafer 10, which includes the plurality of buffer coated individual integrated circuits 20. The uncoated fabricated integrated circuit 21 of FIG. 2 is fabricated in accordance with typical integrated circuit fabrication techniques, as are well known to one skilled in the art.

In FIG. 2, for illustration only, the integrated circuit 21 includes silicon substrate 25, field oxide elements 26 for isolation between transistors and polysilicon gates 28. Metalization 22 is fabricated over a doped oxide 27 which extends over the silicon substrate 25 and other elements 26 and 28. Oxide 24 separates the metalization 22. As stated above, the detail with respect to the integrated circuit 21 is shown for illustration purposes only, and the present invention is not limited to such configuration but only as described in the accompanying claims. The present invention of the integrated circuit device or wafer 10 and the individual circuits 20 including a cyanate ester buffer coat is applicable to any conceivable circuit configuration of a fabricated integrated circuit 21 as would be readily apparent to skilled in the art.

The metalization 22 include bond pads 23 for connecting the individual integrated circuit dies 20 to a packaging device or substrate as is well known to one skilled in the art. The cyanate ester buffer coating material 30 is applied to entirely cover the fabricated integrated circuits 20, including bond pads 23. The cyanate ester buffer coating material forms the buffer coat 30 when dried or cured.

The integrated circuit 21, shown in FIG. 2, has a substantially planar surface to be coated with the cyanate ester coating material 30. However, the cyanate ester coating material may be applied to non-planar fabricated integrated circuits as well as planar surfaces. In non-planar integrated circuits or multi-layer circuits, the cyanate ester coating material will flow into the gaps or valleys between leads and the die. Because of the low dielectric characteristics of a cyanate ester coating material, capacitance between such leads will be reduced.

The cured cyanate ester coating material 30, as shown in FIG. 2, is formed from cyanate ester resin, such as that available from Ciba Polymers, a division of Ciba-Geigy Corporation under the trade designation of Arocy, such as AroCy M resins. These cyanate ester resins are described in the publication "Acrocy® Cyanates Ester Resins Chemistry, Properties, and Applications." by D. A. Shimp, J. R. Christenson, and S. J. Ising (Second Edition—January 1990) herein incorporated by reference thereto.

Cyanate esters are a family of thermosetting resins. Examples of cyanate esters are disclosed in U.S. Pat. Nos. 4,330,658, 4,022,755, 4,740,584, 3,994,949, and 3,744,403, which are incorporated herein by reverence. Preferably, suitable cyanate esters are those cured cyanate esters that have low dielectric loss characteristics such as those having dielectric constants in the range of about 2.0 to about 3.0 at 1 MHZ. Such suitable resins should have dimensional stability at molten solder temperatures, high purity, and excellent adhesion to conductor metals at temperatures up to about 250° C. Cured cyanate ester coating materials, such as those available from Ciba-Geigy, have dielectric constants in the preferred range. However, suitable cyanate ester coating materials with lower dielectric constants and thus, low dissipation factors, are contemplated in accordance with the present invention as described in the accompanying claims. In addition, suitable cured cyanate ester coating material should be extremely durable and tough, having, for example, a free standing tensile elongation of about 2.5 to about 25%. Further, the cured cyanate esters should have a low tensile modules in the range of about 1 to about 5 Gpa and have a low $H_2O$ absorption characteristic in the range of about 0.5% to about 3.0%. The resins should also be processable under the conditions of standard semiconductor manufacturing processes and stable under the conditions of processing such as spin coating, photolithography, development and curing. Moreover, the cured cyanate esters should have a low coefficient of thermal expansion in the range of about 20 to about 70 PPM° C.

A particularly suitable group of cyanate ester resins are bisphenol derivatives containing a ring-forming cyanate functional group (i.e. —O—C=N) in place of the two —OH groups on the bisphenol derivatives. Generally, this family of thermosetting dicyanate monomers and prepolymer resins, are esters of bisphenol and cyanic acid which cyclotrimerize to substituted triazine rings upon heating. Conversion or curing to thermoset plastics forms three-dimensional networks of oxygen-linked triazine rings and bisphenol units. Such networks are termed polycyanurates. A preferred dieyanate monomer can be represented as follows:

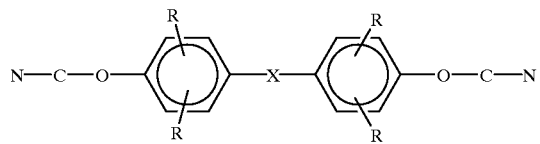

wherein the bisphenol linkage (X) may be any of those commonly incorporated into cyanate esters, such as —O—, —$CH_2OCH_2$—, —S—, —C(O), —O—C(O) —O—, —$SO_2$—, —S(O) —, as well as ($C_1$-$C_{25}$)alkyls, ($C_5$-$C_{18}$) cycloalkyls, ($C_5$-$C_{18}$)aryls, or —($R^1$)C($R^2$) — wherein $R^1$ and $R^2$ independently represent H, a ($C_1$-$C_4$)alkyl group, or a fluorinated $C_1$-$C_4$)alkyl group. Preferably, X is —S—, a ($C_1$-$C_4$)alkyl group, a ($C_5$-$C_{18}$) cycloalkyl group (including fused ring systems) —($R^1$)C($R^2$)— wherein $R^1$ and $R^2$ are independently a ($C_1$-$C_4$)alkyl group or a perfluoro ($C_1$-$C_4$) alkyl group. More preferably, X is —($CH_3$)C($CH_3$) —, —$CH_2$—, —S—, —($CH_3$)CH— as listed in Table 2 of the publication "Arocy® Cyanates Ester Resins Chemistry Properties, and Applications," by D. A. Shimp, J. R. Christenson, and S. J. Ising (Second Edition—January 1990). The ring substituent (R), which may be the same or different, may be hydrogen, a ($C_1$-$C_4$)alkyl group, a ($C_1$-$C_4$) alkoxy group, CH, Br, or any other substituent typically incorporated in cyanate esters. Preferably R is H or a ($C_1$-$C_4$)alkyl. More preferably, R is H or $CH_4$, wherein the $CH_4$ groups are in the ortho position relative to the cyanate groups.

Cyanate ester coating materials are available as dieyanate monomers and also as partially cyclotrimerized dieyanate monomers or prepolymer resins from a number of sources. Cyanate ester prepolymer resins develop cured stat properties which are substantially identical to those of the corresponding cured dieyanate monomers. Thus, the dieyanate monomers as well as the cyclotrimerized prepolymer resins are suitable for use in the present invention. Such materials are available from Ciba Polymers a division of Ciba-Geigy Corporation, Dow Chemical Company, Mitsubishi Gas chemical Company, and Hi-Tek Polymers The cured cyanate ester buffer coat 30, because of its durability, is particularly useful in protection of the integrated circuits 21 after fabrication. Such a cyanate ester buffer coat protects the integrated circuits 21 even after singulation of the wafer 10 during the manufacturing process. As further described below with reference to FIG. 4, the photoimageable characteristics of cyanate ester coating materials are better than other die coats such as polyimides providing for more consistent photomasking and etching results. Cyanate ester coating materials also cure faster as compared to polyimide die coats providing for a faster coating process and, as a result, an increase in output of integrated circuit devices.

Figure 3:
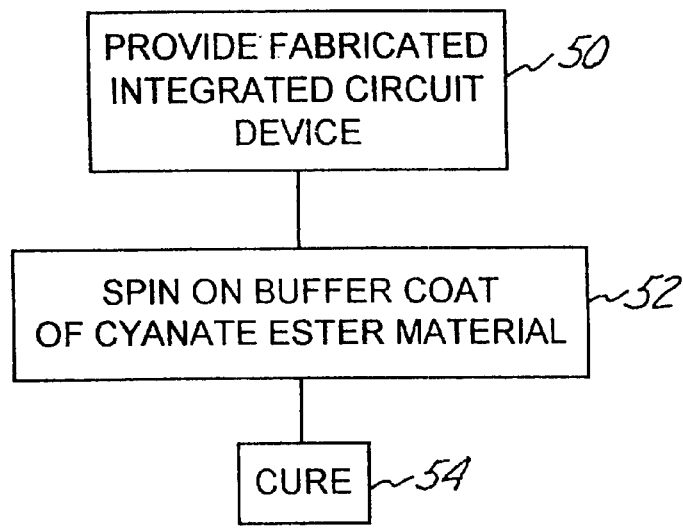
FIG. 3 is a flow diagram showing a process in which a buffer coat is applied to the fabricated integrated circuit wafer of FIG. 1.

The buffer coating process for the integrated circuit devices shall be described with reference to FIG. 3 and the process of connecting the individual integrated circuit or individual die to a package device shall be described with reference to FIGS. 4 and 5. As shown in FIG. 3, an uncoated fabricated integrated circuit device, such as a wafer, including circuits 21, is provided to initiate the process as represented by block 50. As indicated previously, any uncoated fabricated integrated circuit device, whether having an upper surface that is planar or nonplanar, can be coated with a cyanate ester coating material as represented in block 52. The cyanate ester coating material is spun onto the integrated circuit device or fabricated wafer as is well known to one skilled in the art. Any other application technique for covering the upper surface of the integrated circuits 21 may be substituted for the spinning technique. Such alternate techniques of applying the cyanate ester coating material may include, for example, die dispense, extrusion, screen printing, and spray coat.

As is well known to one skilled in the art, when spinning on a coating material such as cyanate ester coating material, the coating material is applied on the wafer surface to be coated and the wafer is then spun such that the coating material is distributed over the wafer by centrifugal force. The final thickness of the layer of coating material on the wafer is based on, at least n part, the spin rate, the viscosity of the coating material, temperature, pressure, etc. The preferred thickness of the cyanate ester coating material applied on the wafer is in the range of about 1 micron to about 24 microns. More preferably, the thickness of the cyanate ester coating material is in the range of about 5 microns to about 15 microns.

The spinning process can be carried out in numerous different steps. For example, the coating material can be dispensed on the wafer while the wafer while the wafer is standing still and then the speed is increased to a particular speed for distributing the material over a period of time. Any number of intermediate spinning steps could be utilized such as going from stand still to an intermediate speed for a particular period of time and then further increasing the spinning speed. It will be readily apparent that a multitude of spinning parameters are contemplated in accordance with the present invention as described in the accompanying claims. The spinning process can be carried out with any member of different spin coating systems.

After the cyanate ester coating material is applied and processed as is known to one skilled in the art, the coating material is cured as represented in block 54. Curing is performed in a furnace or by some other heating unit. The cyanate ester coating material may be cured at a temperature in the range of about 250–290° C. The curing process may vary in temperature or duration and the curing process for the cyanate ester resins provided from the various manufacturers may differ greatly. The curing process may also take place in a number of different atmospheres, including air, nitrogen, or other forming gases. Such curing may also be done under pressure or with some sort of curing catalyst. Further, the cured cyanate ester buffer coat may be machined, ground or milled, if desired, to a specific thickness, such as by chemical mechanical polishing or planarization (CMP).

Figure 4:
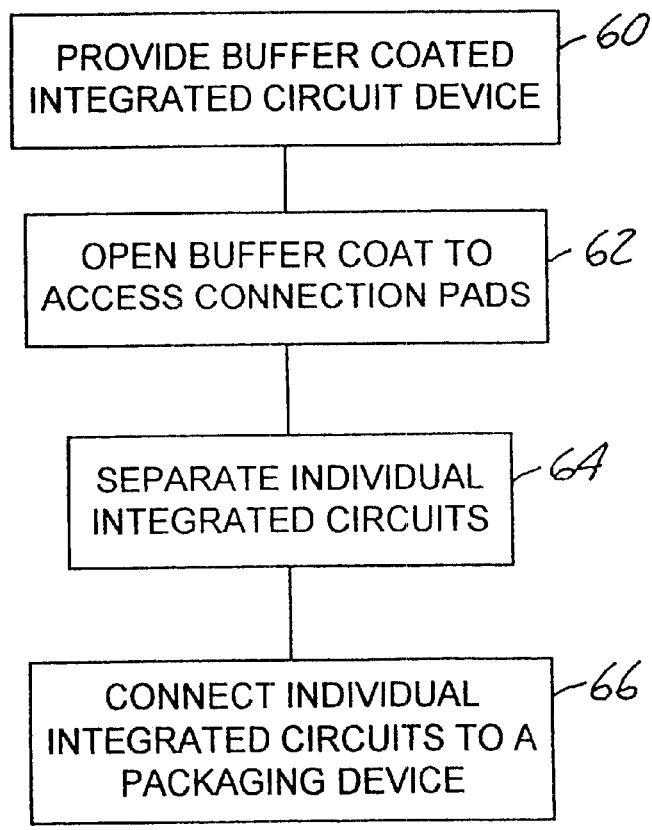
FIG. 4 is a flow diagram showing a process of interconnection of individual integrated circuit die having a buffer coat thereon to a packaging device.

The connection of buffer coated individual integrated circuits 20 of the wafer 10 to packaging devices, such as package substrates, can be accomplished in accordance with the procedure of FIG. 4. The buffer coated wafer 10 is provided from the process described with reference to FIG. 3 and as represented by block 60. The bond pads 23 of the various individual integrated circuits 20 may be opened to access the bond pads as represented in block 62. One or more openings in the buffer coat are made using photomasking and etching as is known to one skilled in the art. A photo resist is applied to the wafer, and the desired pattern of the photo resist is polymerized by ultraviolet light through a photo mask. The unpolymerized areas are removed and an etchant is used to etch the buffer coat 30 to form the one or more openings. One opening in the buffer coat may provide access to one or more die bond pads. The photo resist remaining is then removed as is known to one skilled in the art. The one or more openings may be one of any size or shape. Further, the one or more openings may provide access to the die for purposes other than connection to packaging devices, for example, such access to the die may be utilized for repair, test, etc.

Cyanate ester coating material may also be converted to a photosensitive buffer coat by the addition of photosensitive ingredient's, e.g. a photoactive compound (PAC). This would reduce the number of process steps for opening the buffer coat to access the fabricated water under the buffer coat.

As represented by block 64, the individual integrated circuits 20 are separated or singulated by techniques as known to one skilled in the art, such as etching, sawing, or scribing with a stylus or laser, and then breaking the wafer apart into small squares or rectangles comprising the individual integrated circuit 20. Any of individual, circuits can be connected to a packaging device or substrate which may include a lead frame, or some other device for connecting the bond pads 23 of the integrated circuit device 21 to the packaging device or substrate. The connection is illustrated in FIG. 5 and is represented block 66 of FIG. 4.

Figure 5A:
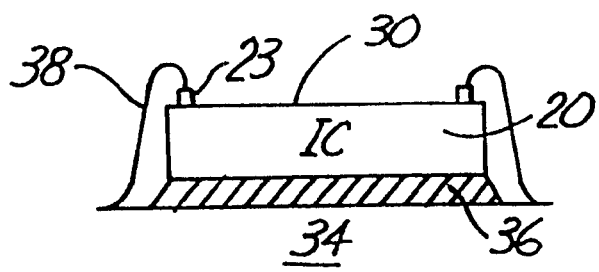
FIG. 5A and 5B (collectively herein "FIG. 5") are illustrations showing connection of an individual integrated circuit die of the wafer of FIG. 1 to a packaging substrate.
Figure 5B:
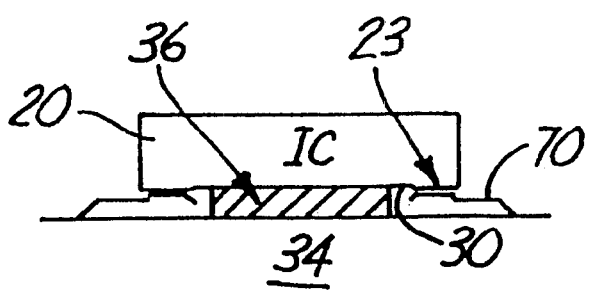

FIG. 5A and 5B show two configurations of mounting die to a packaging substrate. Such configurations are described for illustrative purposes only as the invention is limited only by the accompanying claims. Many other connection techniques are known to those skilled in the art and fall within the scope of the accompanying claims.

FIG. 5A illustrates a wire bonding connection. An individual integrated circuit 20 is attached to a substrate or base 34 such as a lead frame via adhesive 36. The integrated circuit 20 includes the cyanate ester buffer coat 30 with openings in the buffer coat over the bond pads 23 created as per block 62. The bond pads 23 are then connected by leads 38 to metalization on substrate 54.

FIG. 5B illustrates a flip TAB face down connection. An individual integrated circuit 20 is attached to a substrate or base 34 via adhesive 36. The integrated circuit 20 includes the cyanate ester buffer coat 30 with openings in the buffer coat over the bond pads 23 created as per block 62. The bond pads are then connected by tape leads 70 to metalization on substrate 34. FIGS. 5A and 5B illustrate only two types of package interconnection and other types, such as additional TAB bonding, flip bonding of interconnection methods may be used as alternatives.

The cyanate ester buffer coat 39 barriers stress buildup in a package due to mismatching coefficients of thermal expansion. For example, with bond pads interconnected to the substrate using the tiip TAB configuration of FIG. 5B with a filler (not shown) utilized next to the buffer coat 30, if coefficients of thermal expansion between the filter and the buffer coat are not matched to within some predetermined limits, stress on the leads develops in the package containing the integrated circuit 20. The characteristics of the cyanate ester buffer coat 30, because of its compatible coefficients of thermal expansion to substrates, relieves substantial stress in such and like configurations where mismatch of the coefficients would create such stress. Further, the device mounted on a lead frame may be packaged by an encapsulant (not shown) about the buffer coat 30 of FIG. 5A to form the package, such as a DIP package. If the coefficients of expansion between the encapsulant and the buffer coat is mismatched, stress may develop in the package. The characteristics of the cyanate ester buffer coat 30, because or its compatible coefficients of thermal expansion to encapsulants, such as Sunikon 6300, available from Sumitoma Bakelite, JP, relieve substantial stress in such packages where mismatch of the coefficients would create such stress inside the package.

Although the invention has been described with particular reference to a preferred embodiment thereof, variations and modifications of the present invention can be made within a contemplated scope of the following claims as is readily known to one skilled the art.

What is claimed is:

1. A method of producing an integrated circuit device, comprising:

providing a fabricated wafer including a plurality of integrated circuits;

applying a cyanate ester resin on a surface of the fabricated wafer; and curing the cyanate ester resin.

2. The method according to claim 1, wherein the surface of the fabricated wafer is a spinning the cyanate ester resin on the surface of the fabricated wafer.

3. The method according to claim 1, wherein the surface of the fabricated wafer is a substantially planar surface.

4. The method according to claim 1, wherein the surface of the fabricated wafer is a nonplanar surface.

5. The method according to claim 1, wherein the method further comprises defining one or more openings in the cured cyanate ester resin to provide access to the fabricated wafer.

6. The method according to claim 5, wherein the defining one or more openings includes photo masking the cured cyanate ester resin and etching the cured cyanate ester resin to expose die bond pads.

7. The method according to claim 6, wherein the method further comprises separating at least one integrated circuit die from the fabricated wafer and wherein the at least one integrated circuit die is bonded to a packaging device via the exposed die bond pads and encapsulant is applied to at least a portion of the cured cyanate ester resin.

8. A method of forming an integrated circuit device, the method comprising:

providing a fabricated wafer including a plurality of integrated circuit dice, the fabricated wafer having an upper surface;

applying a cyanate ester buffer coating material on the upper surface of the fabricated wafer, wherein the cyanate ester buffer coating material includes a photoactive compound and a cyanate ester resin:

curing the cyanate ester buffer coating material;

defining one or more openings in the cured cyanate ester buffer coating material to provide access to die bond pads of one or more integrated circuit dice of the fabricated wafer;

separating at least one integrated circuit die from the fabricated wafer;

electrically connecting a die package device to die bond pads of the at least one integrated circuit die; and encapsulating at least a portion of the cyanate ester buffer coating material with an encapsulant, the cyanate ester buffer coating material having a coefficient of thermal expansion selected to match the coefficient of thermal expansion of the encapsulant.

9. The method according to claim 8, wherein applying the cyanate ester buffer coating material includes spinning the cyanate ester buffer coating material on the surface of the fabricated wafer.

10. The method according to claim 8, wherein the surface of the fabricated wafer is a substantially planar surface.

11. The method according to claim 8, wherein the surface of the fabricated wafer is a nonplanar surface.

12. The method according to claim 8, wherein defining the one or more openings includes photo masking the cured cyanate ester buffer coating material and etching the cured cyanate ester buffer coating material to expose die bond pads.

* * * * *